United States Patent [19]
Bruns

[11] Patent Number: 5,982,249
[45] Date of Patent: Nov. 9, 1999

[54] REDUCED CROSSTALK MICROSTRIP TRANSMISSION-LINE

[75] Inventor: Michael W. Bruns, Portland, Oreg.

[73] Assignee: Tektronix, Inc., Wilsonville, Oreg.

[21] Appl. No.: 09/044,388

[22] Filed: Mar. 18, 1998

[51] Int. Cl.⁶ ........................................ H01P 3/08
[52] U.S. Cl. ................ 333/1; 174/253; 333/238
[58] Field of Search ............................. 333/1, 12, 238; 174/251, 253

[56] References Cited

U.S. PATENT DOCUMENTS

| | | | |
|---|---|---|---|
| Re. 31,477 | 12/1983 | Marshall | 174/115 |
| 3,179,904 | 4/1965 | Paulsen | 333/1 |
| 3,763,306 | 10/1973 | Marshall | 174/115 |
| 4,441,088 | 4/1984 | Anderson | 333/1 |

*Primary Examiner*—Paul Gensler
*Attorney, Agent, or Firm*—Francis I. Gray

[57] ABSTRACT

A reduced crosstalk microstrip transmission-line has a plurality of microstrips sandwiched between a lower base dielectric layer of flexible circuit material and an upper coverlay with higher permittivity and of different flexible circuit material than the base dielectric layer. With the higher permittivity of the coverlay, the thickness of the coverlay is selected such that the microstrip transmission-line retains practical flexibility and far-end crosstalk to a first neighboring microstrip from a driving channel is zero.

2 Claims, 3 Drawing Sheets

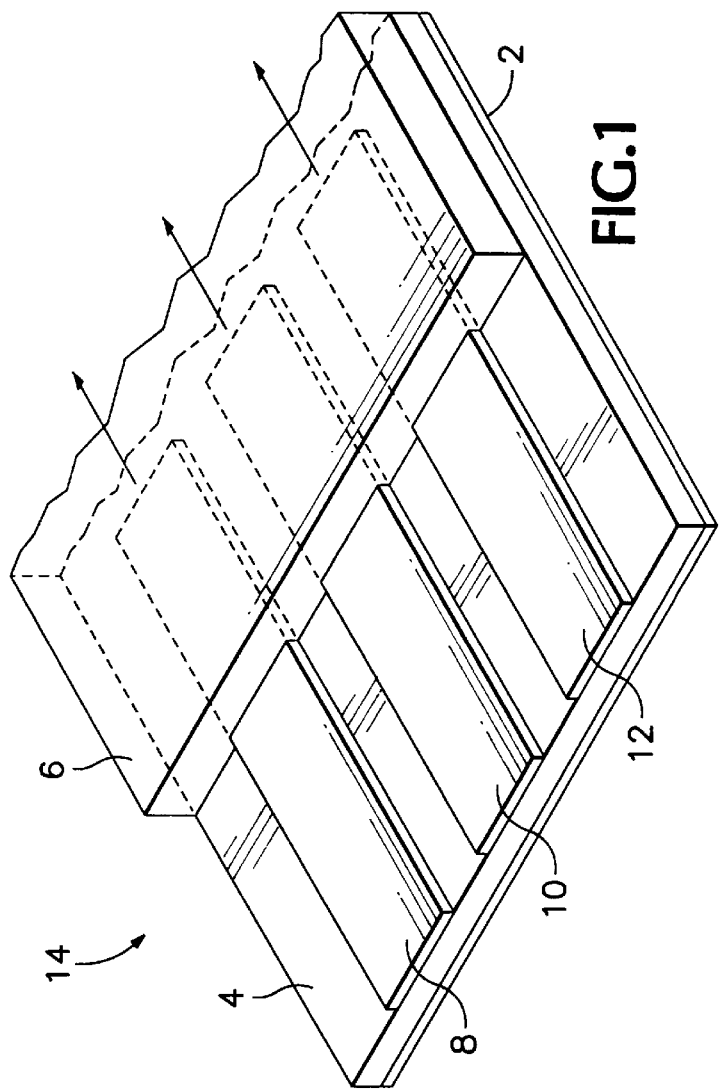
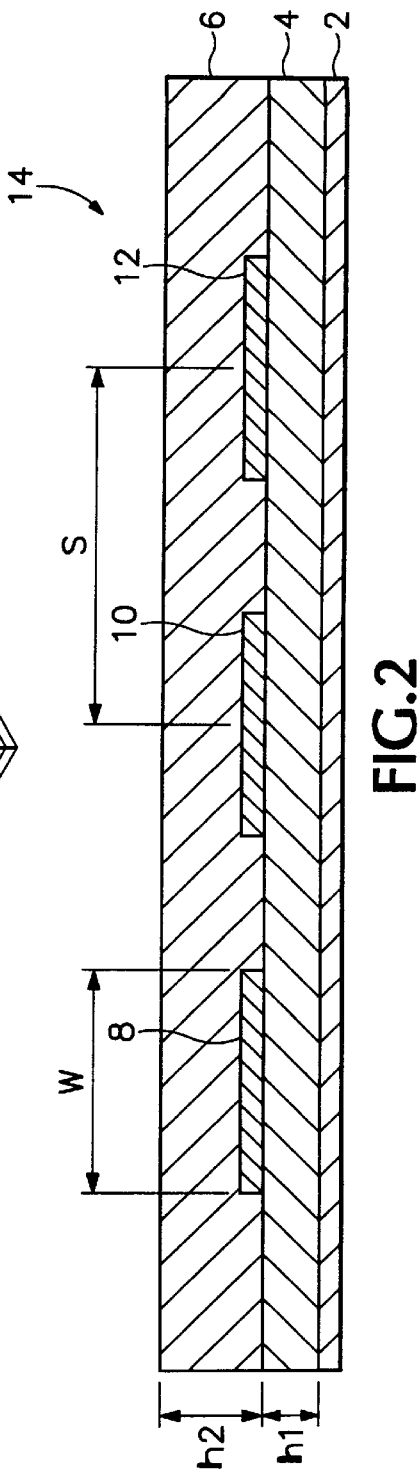

| SERIES 1 | | |
|---|---|---|
| h1 | 120 um | |
| er1 | 2 | |
| h2 | VARIABLE | |
| er2 | 3 | |
| w | 300 | |
| s | 1000 | |
| | CROSSTALK 25ps RAMP | |
| h2 | FIRST | SECOND |
| 60 | −24 | −12 |
| 120 | −12.7 | −7.8 |
| 240 | 8.8 | −5.8 |

| SERIES 3 | | |
|---|---|---|
| h1 | 120 um | |
| er1 | 3 | |
| h2 | VARIABLE | |
| er2 | 10 | |
| w | 300 | |
| s | 1000 | |
| | CROSSTALK 25ps RAMP | |
| h2 | FIRST | SECOND |
| 60 | −17 | −13 |
| 80 | −2 | −12 |
| 120 | 28 | −15 |

REDUCED CROSSTALK MICROSTRIP TRANSMISSION-LINE

BACKGROUND OF THE INVENTION

The present invention relates in general to transmission-lines, and more particularly to microstrip transmission-line cables with two or more microstrip signal lines.

Microstrip transmission-lines are commonly used for high-bandwidth (>1 Ghz) or high data-rate (>300 Mb/s) signal input/output subsystems. When multiple microstrips are combined in a cable, microstrip-to-microstrip interference (crosstalk) between adjacent channels often becomes a dominant cause of signal degradation and noise. The structure of a typical microstrip transmission-line includes two or more microstrip signal lines, a ground plane, a separating base dielectric, and an optional coverlay.

Far-end crosstalk refers to the crosstalk mechanism resulting from disparate propagation velocities of the various propagation modes of the microstrip transmission-line. When the signal asserted on a driving channel of the microstrip transmission-line excites multiple propagation modes, they recombine imperfectly at the far end of the cable resulting in difference signals (crosstalk) on the neighboring lines. Far end crosstalk is dominant in microstrips with lengths on the order of the wavelength of the highest frequency signal of interest or longer.

Addition of a coverlay to a microstrip transmission line reduces far-end crosstalk. Currently, to increase the reduction in crosstalk of microstrip transmission lines, the physical thickness of the coverlay material is increased. This solution is limited since the coverlay thickness must be increased infinitely to completely eliminate crosstalk, and this causes the cable to increase in thickness and decrease in flexibility.

Another type of multi-signal transmission line, disclosed in U.S. Pat. No. 3,763,306 U.S. Pat. No. Re. 31,477 (Marshall), uses a jacket made of a dielectric material having a higher dielectric constant than the dielectric core material of the cable, thus reducing far-end crosstalk, but not eliminating it. Also, microstrip transmission-line cables are structured differently and optimally have a coverlay only on one side for high flexibility and low cost of manufacture. Conversely, the cable disclosed in Marshall is manufactured using an extrusion process. Optimally, microstrip transmission-lines are manufactured as flexible printed wiring boards because of the low cost of production and their specific use as extremely compact, ribbon cable interconnects between modules.

What is desired is a microstrip transmission line cable with no far-end crosstalk, with practical, finite coverlay thickness, and manufactured as a flexible printed wiring board.

SUMMARY OF THE INVENTION

In accordance with the illustrated preferred embodiment of the invention, a microstrip transmission line cable is disclosed that provides for no far-end crosstalk, while still having practical, finite coverlay thickness, and is manufactured as a flexible printed wiring board. Two or more parallel microstrip signal lines are encased between two layers of flexible circuit dielectric insulation material. One layer is a base dielectric layer. The other layer is a coverlay of different material than the base dielectric layer, has a dielectric permittivity higher than the base dielectric layer permittivity, and has a practical physical thickness such that the far-end crosstalk to the first neighboring microstrip from the driving channel is zero. A ground plane layer is coupled to the opposite side of the base dielectric layer.

The objects, advantages, and other novel features of the present invention are apparent from the following detailed description when read in conjunction with the appended claims and attached drawing.

BRIEF DESCRIPTION OF THE DRAWING

FIG. 1 is a perspective view of a microstrip transmission line cable according to the present invention with the coverlay layer partially removed.

FIG. 2 is a cross-sectional view of a microstrip transmission line cable according to the present invention.

DESCRIPTION OF THE PREFERRED EMBODIMENT

Figure 3A:
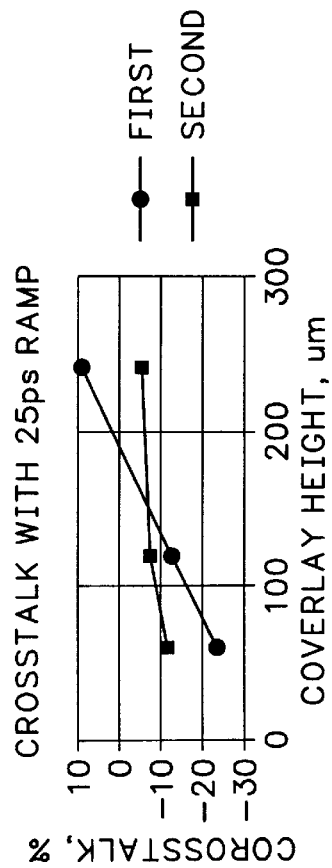
FIG. 3A, 3B, and 3C are three graphs with plots showing zero far end crosstalk for microstrip transmission line cables with coverlay permittivity higher than base dielectric layer permittivity according to the present invention.

Referring to FIGS. 1 and 2 a reduced crosstalk microstrip transmission-line cable 14 is shown with a plurality of parallel microstrip cable lines 8, 10, 12 embedded between a base dielectric layer 4, and a coverlay layer 6. Coupled to the outside surface of the base dielectric 4 is a single ground plane layer 2 of electrically conductive material.

The base dielectric layer 4 is comprised of flexible circuit dielectric material. Flexible circuit dielectric material includes those such as Kapton, Teflon and ceramic-filled Teflons, other polyimides, and other dielectrics in sheet form. The coverlay layer 6 is also of flexible circuit material, and could be made of the same type of flexible circuit material as the base dielectric layer 4, but is comprised of different flexible circuit dielectric material than that of the base dielectric layer 4 in the preferred embodiment. Flexible circuit circuit manufacturing processes are similar to standard printed circuit board manufacturing and are available from many commercial vendors.

Figure 3C:
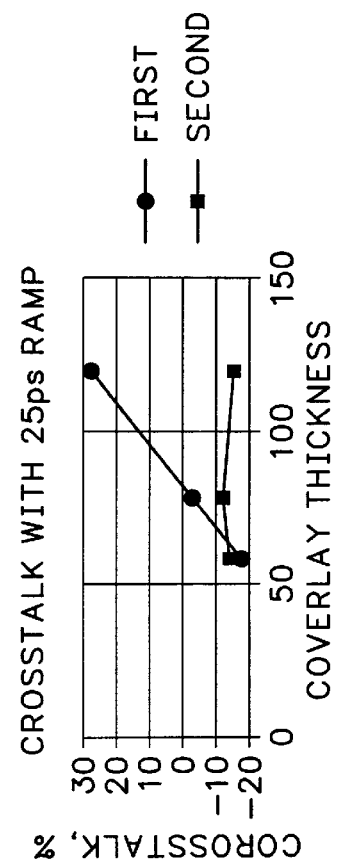
Figure 3B:
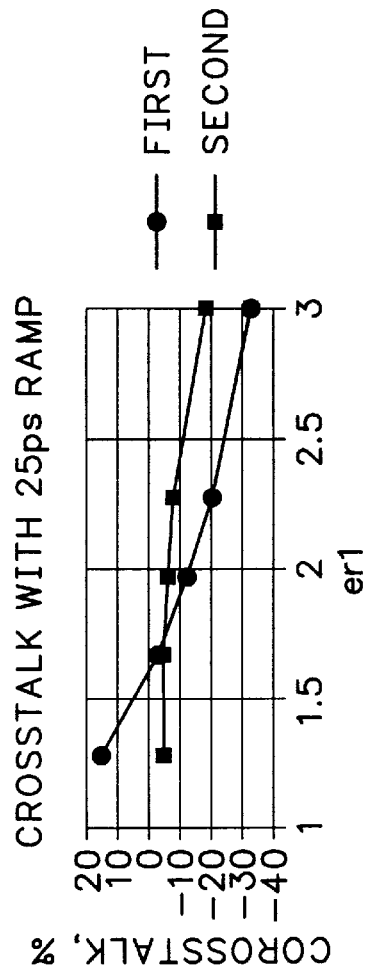

The coverlay layer 6 is also of higher permittivity than the base dielectric layer 4. Referring to FIGS. 3A, 3B, and 3C, it is observed that with the higher permittivity of the coverlay layer 6, the magnitude of the far-end crosstalk expressed as a percentage of the magnitude of the driving channel is zero for certain finite, practical thicknesses of the coverlay layer 6, with the lower permittivity of the base dielectric layer 4. The simulation is based on a two dimensional electromagnetic fields mode (TEM) solution of the cross-section of the microstrip transmission-line cable 14. The results of the electromagnetic solution are mutual capacitance and inductance matrices for the microstrip transmission-line 14 configurations. A simulation model is derived from these matrices and simulated in a simple circuit with matched-impedance sources and loads. The following parameters were used:
h1 base dielectric 4 thickness
h2 coverlay 6 thickness
er1 base dielectric 4 relative permittivity
er2 coverlay 6 permittivity
w microstrip signal line 8, 10, 12 width
s center to center microstrip signal line 8, 10, 12 width The driving signal used was a step with 25 ps rise time edge. While the magnitude of far-end crosstalk is inversely proportional to the rise time, the zero-crosstalk crossings in the plots of FIGS. 3A, 3B, and 3C are independent of rise time. Each graph has a first and second plotting corresponding respectively to the first and second neighboring channels to the driving channel. Three series are shown to observe the zero-crosstalk crossing.

Referring to FIG. 3A:

Series 1: Vary coverlay 6 thickness with fixed coverlay 6 permittivity slightly greater than base dielectric 4 permittivity.

Referring to FIG. 3B:

Series 2: Vary base dielectric 4 permittivity with fixed coverlay 6 thickness and permittivity.

Referring to FIG. 3C:

Series 3: Vary coverlay 6 thickness with fixed coverlay 6 permittivity much greater than base dielectric 4 permittivity.

Given the zero-crosstalk crossings denoted in the graphs of FIGS. 3A, 3B, and 3C, the thickness of the coverlay layer 6, denoted as h2, is selected such that the magnitude of crosstalk expressed as a percentage of the magnitude of the driving signal is zero for the first neighboring channel of the driving channel. This selected thickness is that of the coverlay layer 6 of the preferred embodiment. This thickness may differ depending upon the thickness and lower permittivity of the base dielectric layer as shown in FIGS. 3A, 3B, and 3C, but still provides for a physical coverlay layer 6 thickness that is practical and much smaller than is otherwise required to eliminate crosstalk for the first neighboring channel to the driving channel.

Thus, the present invention provides a microstrip transmission line cable with no far-end crosstalk for the first neighboring channel of the driving channel, with practical, finite coverlay thickness, and manufactured as a flexible printed wiring board. Additions, deletions, and other modifications of the disclosed particular embodiments of the invention will be apparent to those in the art and are within the scope of the following claims.

What is claimed is:

1. A reduced crosstalk microstrip transmission-line comprising:

a plurality of parallel microstrip signal lines;

a base dielectric layer of flexible circuit dielectric material located below and coupled to the microstrip signal lines;

a ground plane layer of an electrically conductive material located below and coupled to the base dielectric layer;

a coverlay layer located above and coupled to the microstrip signal lines, having a higher permittivity than that of the base dielectric layer, with a physical thickness such that the reduced crosstalk microstrip transmission-line retains practical flexibility and far-end crosstalk to a first neighboring microstrip from a driving channel is reduced to zero.

2. An improved microstrip transmission line of the type having a plurality of parallel microstrips sandwiched between a dielectric base layer and a coverlay, the dielectric base layer having a ground plane on the side opposite the coverlay, wherein the improvement comprises the material of the coverlay having a permittivity greater than that of the base dielectric layer and a thickness to reduce far-end crosstalk to a first neighbor microstrip from a driving channel to zero.

* * * * *

UNITED STATES PATENT AND TRADEMARK OFFICE
CERTIFICATE OF CORRECTION

PATENT NO : 5,982,249
DATED : November 9, 1999
INVENTOR(S) : Michael W. Bruns

It is certified that error appears in the above-identified patent and that said Letters Patent is hereby corrected as shown below:

Column 1, after line 3 insert the following:

"STATEMENT REGARDING FEDERALLY SPONSORED RESEARCH OR DEVELOPMENT

This invention was made with Government support under Agreement No. MDA 972-92-C-0011 awarded by DARPA. The Government has certain rights in the invention."

Signed and Sealed this

Thirteenth Day of March, 2001

*Attest:*

NICHOLAS P. GODICI

*Attesting Officer*   *Acting Director of the United States Patent and Trademark Office*